US010992077B2

(12) United States Patent
Gomez et al.

(10) Patent No.: US 10,992,077 B2
(45) Date of Patent: Apr. 27, 2021

(54) MECHANICAL INTERLOCK

(71) Applicant: HEWLETT-PACKARD DEVELOPMENT COMPANY, L.P., Spring, TX (US)

(72) Inventors: Adolfo Gomez, Fort Collins, CO (US); Roger A. Pearson, Fort Collins, CO (US); Richard Duran, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/476,687

(22) PCT Filed: Jan. 17, 2017

(86) PCT No.: PCT/US2017/013704
§ 371 (c)(1),
(2) Date: Jul. 9, 2019

(87) PCT Pub. No.: WO2018/136026
PCT Pub. Date: Jul. 26, 2018

(65) Prior Publication Data
US 2019/0363483 A1   Nov. 28, 2019

(51) Int. Cl.
*H01R 13/52*  (2006.01)
*H05K 5/02*  (2006.01)
*H05K 5/03*  (2006.01)

(52) U.S. Cl.
CPC ....... *H01R 13/5213* (2013.01); *H05K 5/0217* (2013.01); *H05K 5/03* (2013.01)

(58) Field of Classification Search
CPC .... G06F 1/181; H05K 5/0221; H05K 7/1414; H05K 5/03; H05K 5/0217; H01R 13/5213
See application file for complete search history.

(56) References Cited

U.S. PATENT DOCUMENTS

| 4,577,249 | A | * | 3/1986 | Cantwell | G11B 17/32 360/251.1 |
| 4,912,747 | A | | 3/1990 | Sakama | |
| 5,341,273 | A | * | 8/1994 | Sharp | H02B 1/056 361/641 |
| 5,402,322 | A | * | 3/1995 | Kunkler | H05K 7/1428 174/541 |
| 5,636,714 | A | * | 6/1997 | Viola | B66B 13/06 187/280 |

(Continued)

FOREIGN PATENT DOCUMENTS

EP   2458607 A1   5/2012

*Primary Examiner* — Briggitte R. Hammond
(74) *Attorney, Agent, or Firm* — HP, Inc. Patent Department

(57) ABSTRACT

A mechanical interlock for securing a cover to a housing may include a cover latch coupled to a wall of a housing, and a spring biasing the cover latch in a first direction and coupled between the wall of the housing and the cover latch. The mechanical interlock may further include an arm coupled to the cover latch at a first end of the arm, and an electrical socket aperture defined within the wall of the housing juxtaposed to a second end of the arm. When the cover latch is returned to the first position via the spring after the cover is removed from the housing, the arm permits for the electrical cord to interface with the electrical socket.

15 Claims, 6 Drawing Sheets

(56) References Cited

U.S. PATENT DOCUMENTS

| | | | |
|---|---|---|---|
| 5,918,875 A * | 7/1999 | Masley | B65H 1/266 |
| | | | 271/145 |
| 6,964,576 B2 | 11/2005 | Crutchfield | |
| 7,012,493 B1 * | 3/2006 | Marks | H01H 71/126 |
| | | | 335/167 |
| 7,152,440 B1 | 12/2006 | Austin | |
| 7,207,812 B1 | 4/2007 | Wong | |
| 8,420,963 B2 * | 4/2013 | Bhathija | H01H 9/286 |
| | | | 200/50.12 |
| 8,905,769 B2 | 12/2014 | Neukam | |
| 9,025,320 B2 | 5/2015 | Neukam | |
| 2005/0245116 A1 | 11/2005 | Thomas | |
| 2007/0228741 A1 | 10/2007 | Park et al. | |
| 2011/0155447 A1 | 6/2011 | Nihashi | |

* cited by examiner

MECHANICAL INTERLOCK

BACKGROUND

Computing devices have become ubiquitous throughout the world for use in a large portion of an individual's life. The various components of a computing device may be contained within a housing that keeps contaminants out of contact with the components, helps ensure that the components are not damaged by a user, and helps ensure that a user is not hurt by the electrical components by, for example, electrical shock or other energy hazard.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
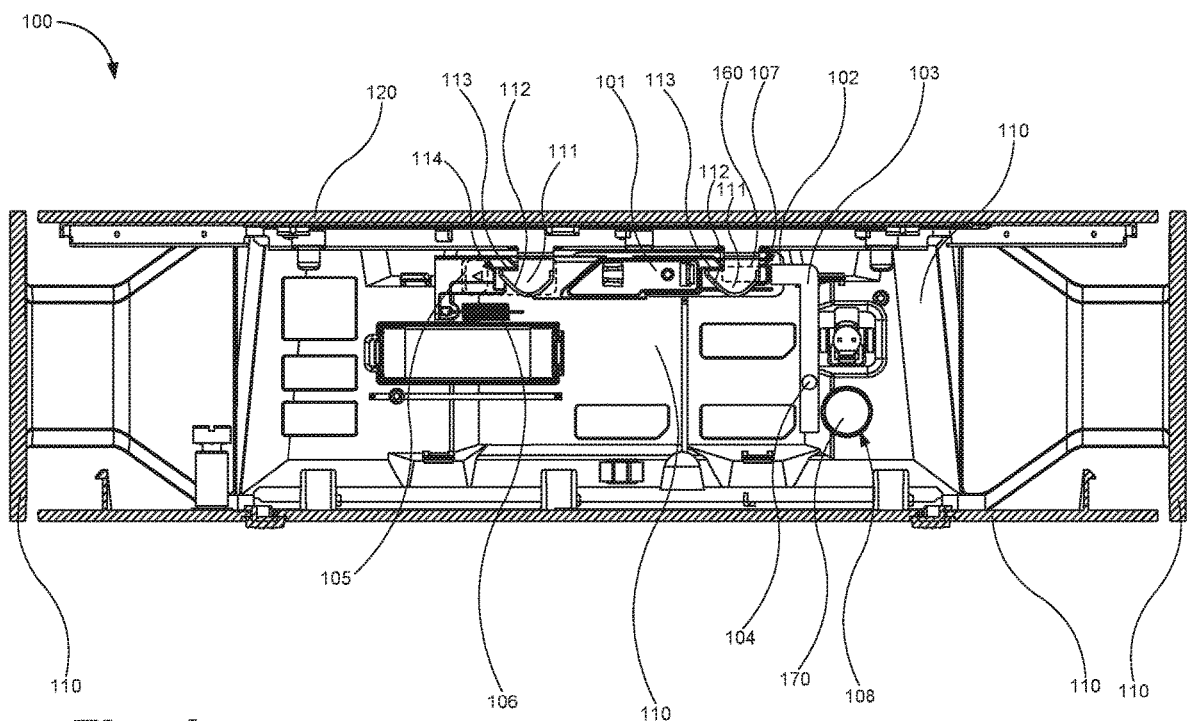
FIG. 1 is a diagram of a mechanical interlock for securing a cover to a housing with a cover latch in a first position, according to one example of the principles described herein.

As mentioned herein, a housing may be used to protect the components of a computing device and protect a user from electrical shock and other energy hazards that may come about by touching the components. Some computing devices, however, may include a housing that provides access by an individual to the components of the computing device. Access to the components of the computing device may be provided to allow, for example, a computer technician or other individual to service the computing device. Servicing a computing device may include repair or replacing at least one component of the computing device.

However, even for highly trained computer technicians, safety regulations may be put in place to protect individuals from hazardous parts of the computing device. These safety regulations may be put into place by governing bodies such as is the case with International Electric Committee (IEC), Underwriters Laboratories (UL LLC), or the Occupational Safety and Health Administration (OSHA). For example, safety interlocks may be included in the housing of the computing device, and may be regulated and designed such that hazards such as electrical power sources are removed before covers, doors, or other accesses to the components of the computing device are functional. For example, for protection against electrical shock, radiation, and other energy hazards, removal, opening, or withdrawal of the cover may be regulated to: ensure previous de-energization of the components; or automatically initiate disconnection of the energy supply to the components and reduce within two seconds the voltage to 42.2 volts AC (V AC) or 60V DC or less and the energy level to less than 20 joules (J). For moving parts that will continue to move through momentum and will continue to present a mechanical hazard, removal, opening, or withdrawal of the cover may be regulated to: ensure previous reduction of movement to an acceptable, safe level; or automatically initiate reduction of the movement to an acceptable, safe level. Thus, measures may be taken to ensure the safety of individuals while still providing access to the interior of a computing device and its various components.

Examples described herein provide a mechanical interlock for securing a cover to a housing. The mechanical interlock may include a cover latch coupled to a wall of a housing, and a spring biasing the cover latch in a first direction and coupled between the wall of the housing and the cover latch. The mechanical interlock may further include an arm coupled to the cover latch at a first end of the arm, and an electrical socket aperture defined within the wall of the housing juxtaposed to a second end of the arm. When the cover latch is in a first position, the arm permits for an electrical cord to interface with the electrical socket and precludes removal of a cover of the housing while the electrical cord is interfaced with the electrical socket. Further, when the cover latch is in a second position, the arm precludes the electrical cord from interfacing with the electrical socket. Still further, when the cover latch is returned to the first position via the spring after the cover is removed from the housing, the arm permits for the electrical cord to interface with the electrical socket.

In one example, the arm is rotatable about a pivot. The pivot may be coupled to the wall of the housing. The arm extends from the cover latch in a second direction perpendicular to the first direction. When the cover latch is returned to the first position via the spring, the arm precludes the cover of the housing from coupling with the housing while the electrical cord is interfaced with the electrical socket.

A lock aperture may be defined in the wall of the housing and a portion of the cover latch. When the cover latch is in the first position, the cover latch permits for a lock to interface with the housing and precludes removal of the cover of the housing while the lock is interfaced with the housing. Further, when the cover latch is in the second position, the cover latch precludes the lock from interfacing with the housing. Still further, when the cover latch is returned to the first position via the spring, the cover latch permits for the lock to interface with the housing.

Examples described herein also provide a housing for an electrical device. The housing includes a cover comprising at least one locking pin, a cover latch coupled to a wall of the housing, a spring biasing the cover latch in a first direction and coupled between the wall of the housing and the cover latch, an arm coupled to the cover latch at a first end of the arm, and an electrical socket aperture defined within the wall of the housing juxtaposed to a second end of the arm. When the cover latch is in a first position the at least one locking pin is engaged with the cover latch precluding removal of the cover from the housing, and the arm permits for an electrical cord to interface with the electrical socket and precludes removal of a cover of the housing while the electrical cord is interfaced with the electrical socket. When the cover latch is in a second position the at least one locking pin is disengaged from the cover latch allowing removal of the cover from the housing, and the arm precludes the electrical cord from interfacing with the electrical socket. When the cover latch is returned to the first position via the spring, and the cover is removed from the housing, the arm permits for the electrical cord to interface with the electrical socket.

The at least one locking pin includes a ramp and a hook portion. When the cover is coupled to the housing, the ramp interfaces with the cover latch to force the cover latch in a second direction, and the hook portion engages with a notch defined in the cover latch to cause the cover latch to return to the first position. Further, the arm is rotatable about a pivot, the pivot being coupled to the wall of the housing. In one example, the arm extends from the cover latch in a second direction perpendicular to the first direction. When the cover latch is returned to the first position via the spring, the arm precludes the cover of the housing from coupling with the housing while the electrical cord is interfaced with the electrical socket.

The housing may also include a lock aperture defined in the wall of the housing and the cover latch. When the cover latch is in the first position, the cover latch permits for a lock to interface with the housing and precludes removal of the cover of the housing while the lock is interfaced with the housing. Further, when the cover latch is in the second position, the cover latch precludes the lock from interfacing with the housing. Still further, when the cover latch is returned to the first position via the spring, the cover latch permits for the lock to interface with the housing.

Examples described herein also provide a power supply interface. The power supply interface may include an electrical socket for receiving an electrical cord defined in a wall of a housing, a cover selectively removable from the housing, the cover comprising at least one locking pin, a cover latch coupled to a wall of the housing, a spring biasing the cover latch in a first direction and coupled between the wall of the housing and the cover latch, and an arm coupled to the cover latch at a first end of the arm. When the cover latch is in a first position the at least one locking pin is engaged with the cover latch precluding removal of the cover from the housing, and the arm permits for the electrical cord to interface with the electrical socket and precludes removal of a cover of the housing while the electrical cord is interfaced with the electrical socket. Further, when the cover latch is in a second position, the at least one locking pin is disengaged from the cover latch allowing removal of the cover from the housing, the arm precludes the electrical cord from interfacing with the electrical socket. Still further, when the cover latch is returned to the first position via the spring, and the cover is removed from the housing, the arm permits for the electrical cord to interface with the electrical socket.

The at least one locking pin comprises a ramp, and a hook portion. When the cover is coupled to the housing, the ramp interfaces with the cover latch to force the cover latch in a second direction, and the hook portion engages with a notch defined in the cover latch to cause the cover latch to return to the first position.

The power supply interface may include a lock aperture defined in the wall of the housing and the cover latch. When the cover latch is in the first position, the cover latch permits for a lock to interface with the housing and precludes removal of the cover of the housing while the lock is interfaced with the housing. Further, when the cover latch is in the second position, the cover latch precludes the lock from interfacing with the housing. Still further, when the cover latch is returned to the first position via the spring, the cover latch permits for the lock to interface with the housing. Even still further, when the cover latch is returned to the first position via the spring, the arm precludes the cover of the housing from coupling with the housing while the electrical cord is interfaced with the electrical socket In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Figure 2:
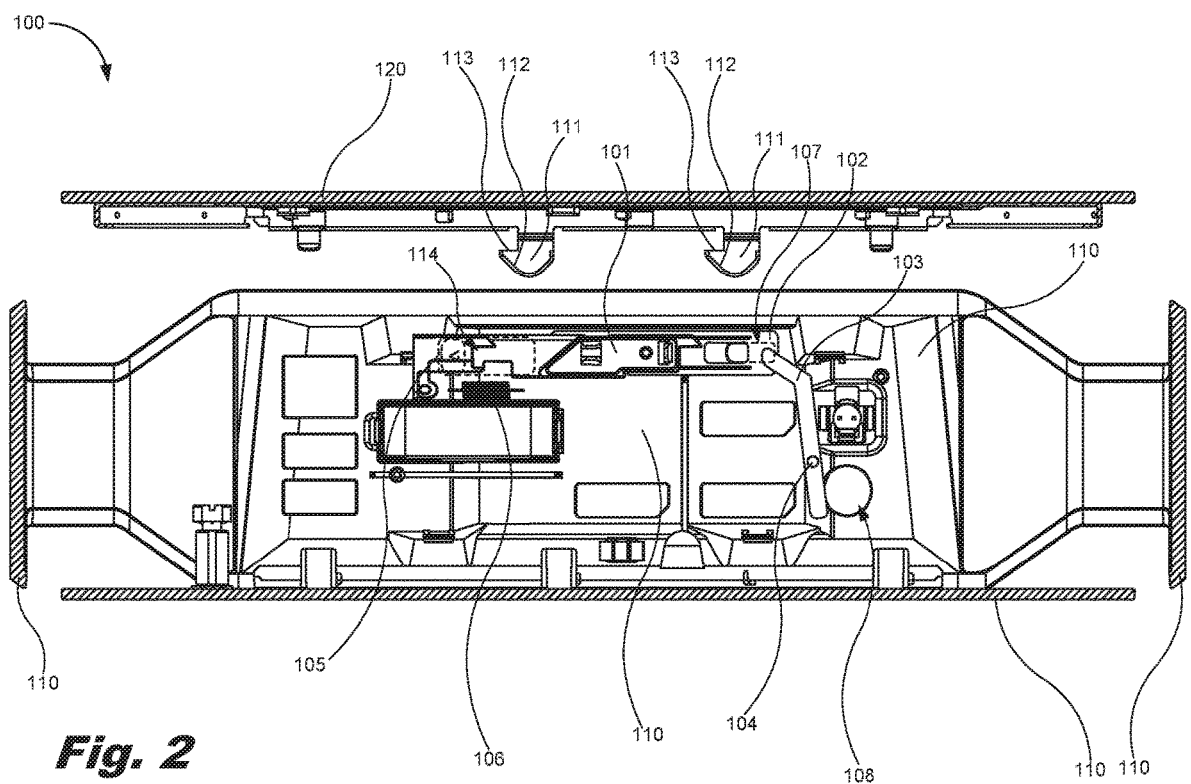
FIG. 2 is a diagram of the mechanical interlock of FIG. 1 with a cover of the housing disengaged and the cover latch in a second position, according to one example of the principles described herein.
Figure 3:
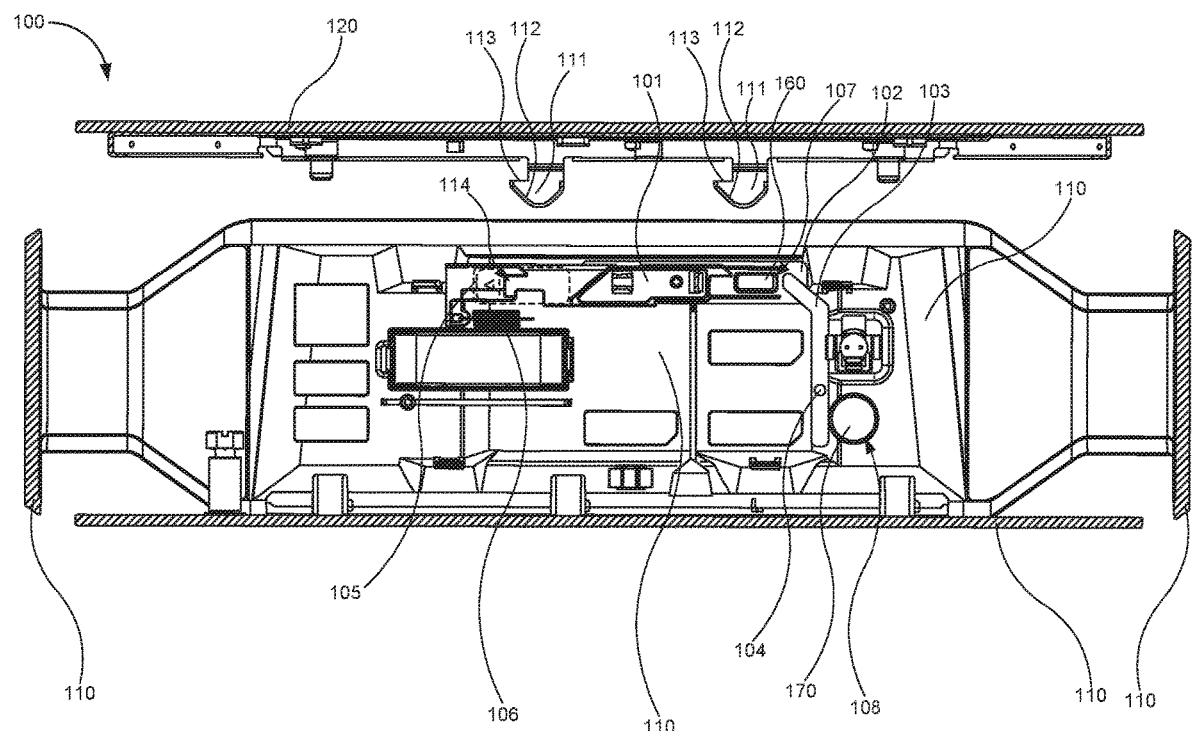
FIG. 3 is a diagram of the mechanical interlock of FIG. 1 with a cover of the housing disengaged and the cover latch in the first position, according to one example of the principles described herein.

FIG. 1 is a diagram of a mechanical interlock (100) for securing a cover (120) to a housing (110) with a cover latch (101) in a first position, according to one example of the principles described herein. FIG. 2 is a diagram of the mechanical interlock (100) of FIG. 1 with a cover (120) of the housing (110) disengaged and the cover latch (101) in a second position, according to one example of the principles described herein. Further, FIG. 3 is a diagram of the mechanical interlock (100) of FIG. 1 with a cover (120) of the housing (110) disengaged and the cover latch (101) in the first position, according to one example of the principles described herein. The various elements of the mechanical interlock (100) of FIG. 1 will now be described, followed by a description regarding the function of the mechanical interlock (100).

A housing (110) may be used to contain electrical and electronic components that make up the various systems and subsystems of, for example, a computing device. The housing may take any shape or form, and may include any number of walls that form an enclosure. A cover (120) may be removably attached to the housing to provide access to the electrical and electronic components.

The mechanical interlock (100) includes a cover latch (101) coupled to a latch extension (102). In the example of FIG. 1, the latch extension (102) is coupled to an arm (103) that is rotatably coupled to a wall of the housing (110) via a pivot pin (104). The arm (103) pivots about the pivot pin (104) as the cover latch (101) and latch extension (102) move horizontally relative to their depiction in FIGS. 1 through 3. In one example, the arm (103) is coupled to the latch extension (102) via a hinge or similar device that allows the arm (103) to articulate with respect to the latch extension (102). In one example, the arm (103) extends from the cover latch (101) and latch extension (102) in a second direction perpendicular to a first direction the defines the direction of movement of the cover latch (101) and latch extension (102).

The cover latch (101) and latch extension (102) may be movably coupled to the housing (110) such that the cover latch (101) and latch extension (102) may move horizontally as depicted in FIGS. 1 through 3. The cover latch (101) and latch extension (102) may move along, for example, rails that couple the cover latch (101) and latch extension (102) to the housing (110) as well as allow the cover latch (101) and latch extension (102) to translationally move along the rails. A latch release (105) may be coupled to the cover latch (101) and latch extension (102). The latch release (105) may protrude to the exterior of the housing (110) and is used to actuate the mechanical interlock (100). The latch release (105) is coupled to the latch extension (102) via the cover latch (101), and is manually actuated by a user to remove the cover (120). Actuation of the latch release (105) causes the arm (103) to rotate about the pivot pin (104).

The mechanical interlock (100) includes a spring (106) coupled between the cover latch (101) or the latch extension (102), and the housing (110) or other chassis portion of the computing device. The spring (106) is biased to cause the cover latch (101) and latch extension (102) to pull the cover latch (101) and latch extension (102) to the right. In this manner, when a user is not actuating the mechanical interlock (100) via the latch release (105), the mechanical interlock (100) is brought to or returned to an original or first position where the cover latch (101) and latch extension (102) are forced to the right as depicted in FIGS. 1 through 3.

The cover latch (101) of the mechanical interlock (100) may include any coupling device that couples the cover (120) to the housing (110). In one example, the cover (120) includes at least one locking pin (111). The at least one locking pin includes a ramp (112) and a hook portion (113). When the cover (120) is coupled to the housing (110), the ramp (112) interfaces with the cover latch (101) to force the cover latch (101) in a second direction opposite the bias of the spring (106), The hook portion (113) engages with a notch (114) defined in the cover latch (101) to cause the cover latch (101) to return to a first position where the spring (106) has pulled the cover latch (101) to the right completely. In another example, the placement of the locking pin (111) and the notch (114) may be reversed where the locking pin (111) is included as part of the cover latch (101) and the notch (114) is defined in a portion of the cover (120). Any other type or form of coupling device may be used to couple the cover (120) to the housing (110).

The cover latch (101), latch extension (102), arm (103), pivot pin (104), latch release (105), and other portions of the mechanical interlock (100) of FIGS. 1 through 3 may be made of materials able to withstand several thousand cycles of use. In one example, the cover latch (101), latch extension (102), arm (103), pivot pin (104), latch release (105), and other portions of the mechanical interlock (100) of FIGS. 1 through 3 may be made of metals, plastics, composites, or other materials. In one example, these elements may be made of any material that may withstand, for example, at least 10,000 cycles of actuation without failure.

The housing (110) may include apertures defined therein that allow for the coupling of power cords (170), Kensington locks (160), data transmission cords, and other cords and devices. For example, a lock aperture (107) may be defined within the housing (110) to allow a Kensington lock (160) to be coupled to the housing and other portions of the computing device including, for example, a chassis or other framework housed by the housing (110). In this example, the latch extension (102) also includes the lock aperture (107) such that, when a Kensington lock (160) is coupled through the housing (110), the Kensington lock (160) precludes the latch extension (102) from moving left or otherwise translationally with the cover latch (101), the latch release (105), and the arm (103).

The housing (110) may include a power cable aperture (108) defined within the housing (110) to allow a power cable (170) to be coupled through the housing (110) and electrically power the electrical and electronic components that make up the various systems and subsystems of the computing device. In this example, the power cable aperture (108) is located juxtaposed to a distal end of the arm (103) relative to the end of the arm (103) that is coupled to the latch extension (102). In this configuration, when a power cord (170) is coupled through the housing (110), the power cord (170) precludes the arm (103) from rotating about the pivot pin (104), and precludes the distal end of the arm (103) relative to the end of the arm (103) that is coupled to the latch extension (102) from moving right and past the power cable aperture (108), and precludes any translational movement of the cover latch (101), the latch extension (102), and the latch release (105).

Even though a lock aperture (107) and a power cable aperture (108) are described in connection with FIGS. 1 through 3, any type of aperture may be included within the mechanical interlock (100). In one example, the mechanical interlock (100) may be arranged such that the coupling of a Kensington lock (160) through the lock aperture (107), the coupling of a power cable through the power cable aperture (108), the coupling of another cord or device through another aperture, or combinations thereof preclude the actuation of the mechanical interlock (100) including movement of the cover latch (101), the latch extension (102), the arm (103), and the latch release (105). Thus, even in situations where several apertures are defined in the housing (110), the inclusion of even one of the cords or devices within these apertures, may preclude the mechanical interlock (100) from actuating. In another example, the actuation of the mechanical interlock (100) may be precluded by a combination of at least two apertures (107, 108) being filled.

The actuation of the mechanical interlock (100) will now be described. In FIG. 1, the cover (120) is engaged with the cover latch (101) such that the cover (120) is coupled to the housing (110) and encloses the electrical and electronic components that make up the various systems and subsystems of, for example, a computing device. In this state, the spring (106) biases the mechanical interlock (100) to the right, the arm (103) does not obstruct the power cable aperture (108), and the latch extension (102) does not obstruct the lock aperture (107). A Kensington lock (160) and a power cord (170) may be selectively removed and coupled through the housing (110) without being precluded by the mechanical interlock (100).

Further, in this state, if the user is to actuate the mechanical interlock (100) by moving the latch release (105) in the left direction against the bias of the spring (106), the arm (103) will be restricted from moving due to the presence of the power cord (170) within the power cable aperture (108), and the latch extension (102) will be restricted from moving due to the presence of the Kensington lock (160) within the lock aperture (107). In this manner, a user may not access the electrical and electronic components that make up the various systems and subsystems of the computing device, and will reduce or eliminate the possibility of the user sustaining any injury from electrical shock or other energy hazards, or moving parts.

In contrast, FIG. 2 depicts the mechanical interlock (100) with the power cord (170) removed from the power cable aperture (108), and the Kensington locks (160) removed from the lock aperture (107). In this state, with all power cords (170), Kensington locks (160), data transmission cords, and other cords and devices removed from the housing (110), the arm (103) is able to move past the power cable aperture (108) and the latch extension (102) is able to move past the lock aperture (107). In this manner, the mechanical interlock (100) is able to actuate to disengage the cover (120) from the cover latch (101) to allow the cover (120) to be removed or separated from the housing (110). However, in one example, removal of one of the power cords (170), Kensington locks (160), data transmission cords, or other cords and devices from the housing (110), allows for the actuation of the mechanical interlock (100), and allows the arm (103) to move past the power cable aperture (108). For example, removal of the power cord (170) from the power cable aperture (108) may allow for the mechanical interlock (100) to actuate even if other cords or devices such as the Kensington lock (160) within the lock aperture (107) are still present.

FIG. 3 depicts the mechanical interlock (100) with the power cord (170) engaged with the power cable aperture (108), and the Kensington locks (160) engaged with the lock aperture (107) while the cover (120) is removed from the housing (110). The ability to couple a power cord (170), a Kensington lock (160), data transmission cords, and other cords and devices to the electrical and electronic components that make up the various systems and subsystems of the computing device to be coupled to the computing device after removal of the cover (120) allows for a technician or other individual to perform maintenance items on the computing device. The mechanical interlock (100) protects individuals from inadvertent injury while still providing a powered access to the components of the computing device.

Figure 4:
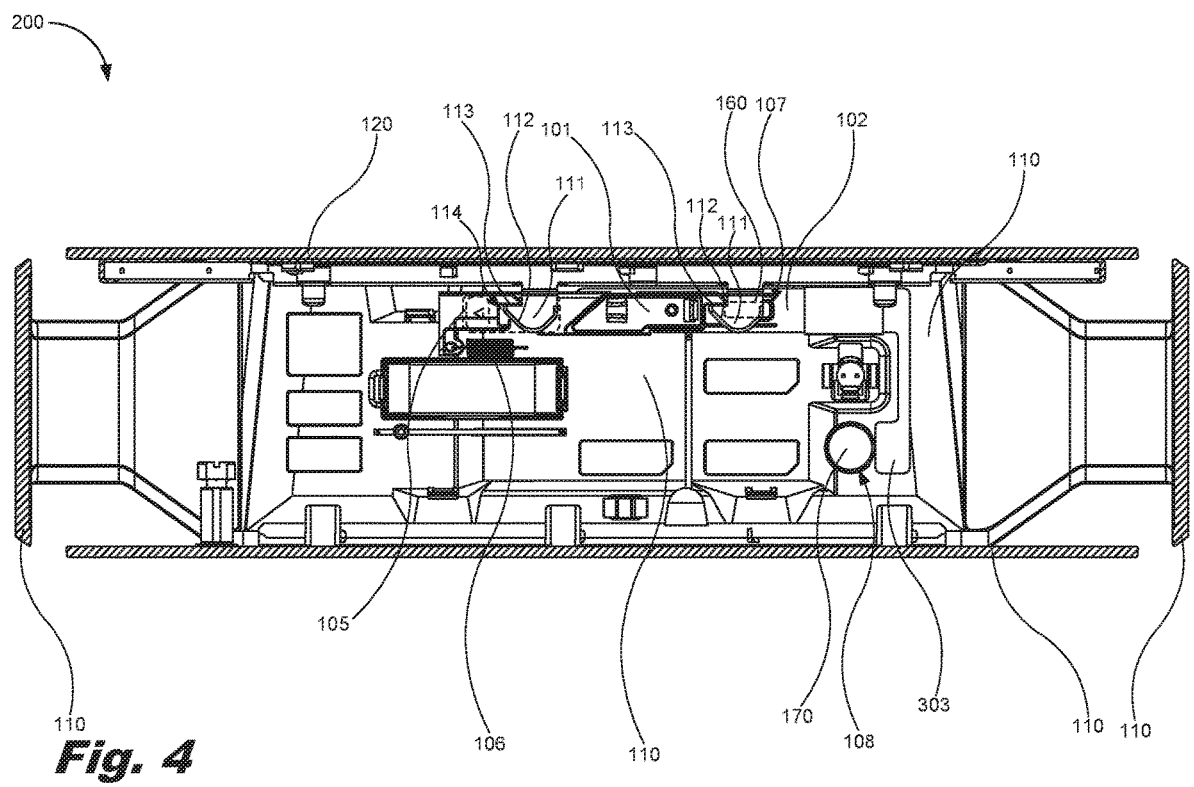
FIG. 4 is a diagram of a mechanical interlock for securing a cover to a housing and the cover latch in a first position, according to another example of the principles described herein.
Figure 5:
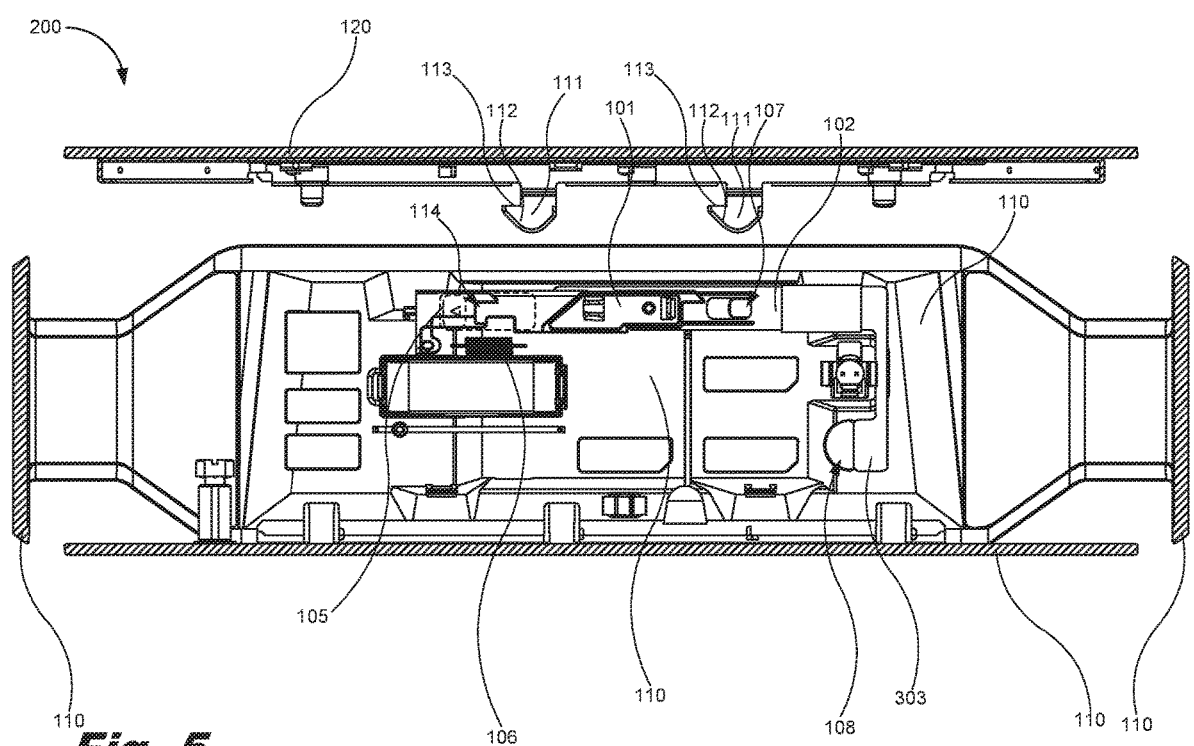
FIG. 5 is a diagram of the mechanical interlock of FIG. 4 with a cover of the housing disengaged and the cover latch in a second position, according to one example of the principles described herein.
Figure 6:
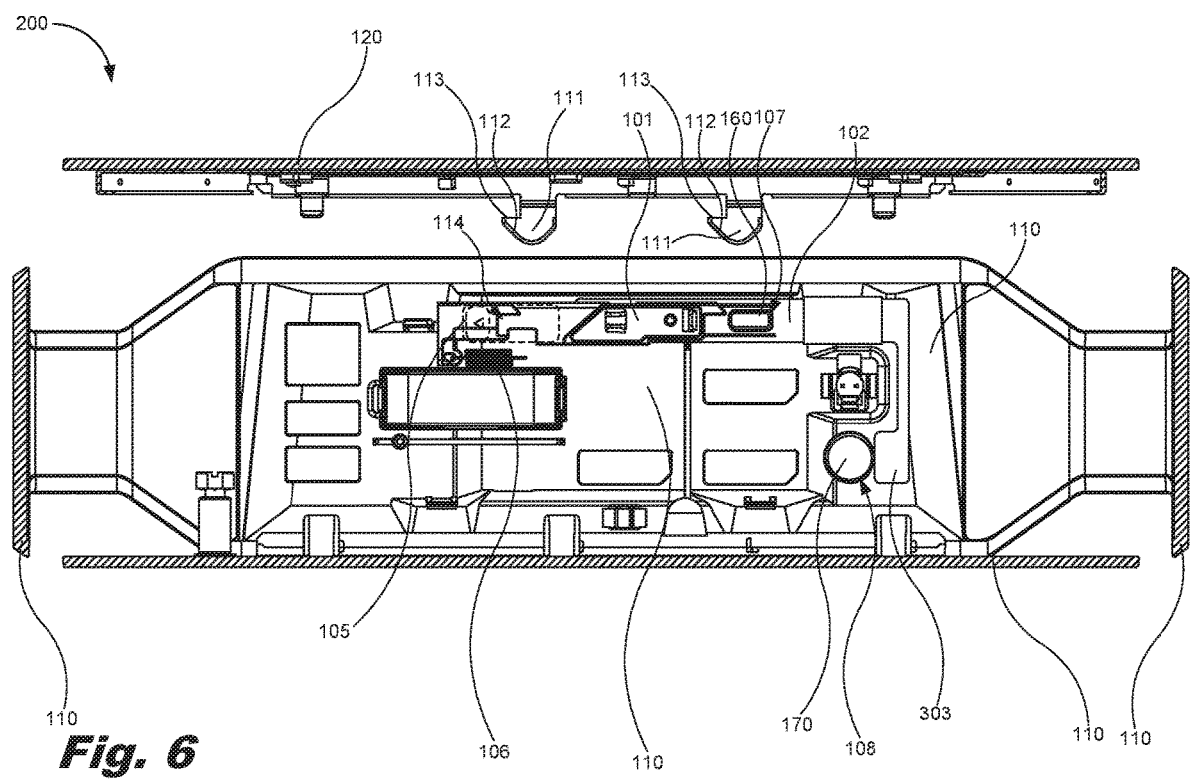
FIG. 6 is a diagram of the mechanical interlock of FIG. 4 with a cover of the housing disengaged and the cover latch in the first position, according to one example of the principles described herein.

FIG. 4 is a diagram of a mechanical interlock (200) for securing a cover (120) to a housing (110) and the cover latch (101) in a first position, according to another example of the principles described herein. FIG. 5 is a diagram of the mechanical interlock (200) of FIG. 4 with a cover (120) of the housing (110) disengaged and the cover latch (101) in a second position, according to one example of the principles described herein. FIG. 6 is a diagram of the mechanical interlock (100) of FIG. 4 with a cover (120) of the housing (110) disengaged and the cover latch (101) in the first position, according to one example of the principles described herein. The example of FIGS. 4 through 6 include similar elements as those presented herein in connection with FIGS. 1 through 3.

The example of FIGS. 4 through 6, however, include a latch extension arm (303) instead of the arm (103) and pivot pin (104) as depicted in FIGS. 1 through 3. The latch extension arm (303) may be formed as a part of the latch extension (102) or may be coupled to the latch extension (102) as a separate element, and extends from the latch extension (102) in a direction perpendicular to the direction of movement of the latch extension (102) and cover latch (101). The latch extension arm (303) may be used within the housing (110) in situations where the housing provides room for the latch extension arm (303).

When actuating the mechanical interlock (200) of FIGS. 4 through 6, in FIG. 4, the cover (120) is engaged with the cover latch (101) such that the cover (120) is coupled to the housing (110) and encloses the electrical and electronic components that make up the various systems and subsystems of, for example, a computing device. In this state, the spring (106) biases the mechanical interlock (200) to the right, the latch extension arm (303) does not obstruct the power cable aperture (108), and the latch extension (102) does not obstruct the lock aperture (107). A Kensington lock (160) and a power cord (170) may be selectively removed and coupled through the housing (110) without being precluded by the mechanical interlock (200).

Further, in this state, if the user is to actuate the mechanical interlock (200) by moving the latch release (105) in the left direction against the bias of the spring (106), the latch extension arm (303) will be restricted from moving to the left with the latch extension (102) and cover latch (101) due to the presence of the power cord (170) within the power cable aperture (108), and the latch extension (102) will be restricted from moving due to the presence of the Kensington lock (160) within the lock aperture (107). In this manner, a user may not access the electrical and electronic components that make up the various systems and subsystems of the computing device, and will reduce or eliminate the possibility of the user sustaining any injury from electrical shock or other energy hazards, or moving parts.

The cover latch (101), latch extension (102), latch extension arm (303), latch release (105), and other portions of the mechanical interlock (200) of FIGS. 4 through 6 may be made of materials able to withstand several thousand cycles of use. In one example, cover latch (101), latch extension (102), latch extension arm (303), latch release (105), and other portions of the mechanical interlock (200) of FIGS. 4 through 6 may be made of metals, plastics, composites, or other material. In one example, these elements may be made of any material that may withstand, for example, at least 10,000 cycles of actuation without failure.

In contrast, FIG. 5 depicts the mechanical interlock (200) with the power cord (170) removed from the power cable aperture (108), and the Kensington locks (160) removed from the lock aperture (107). In this state, with all power cords (170), Kensington locks (160), data transmission cords, and other cords and devices removed from the housing (110), the latch extension arm (303) is able to move past the power cable aperture (108) and the latch extension (102) is able to move past the lock aperture (107). In this manner, the mechanical interlock (200) is able to actuate to disengage the cover (120) from the cover latch (101) to allow the cover (120) to be removed or separated from the housing (110).

FIG. 6 depicts the mechanical interlock (200) with the power cord (170) engaged with the power cable aperture (108), and the Kensington locks (160) engaged with the lock aperture (107) while the cover (120) is removed from the housing (110). Again, as described herein in connection with FIGS. 1 through 3, the ability to couple a power cord (170), a Kensington lock (160), data transmission cords, and other cords and devices to the electrical and electronic components that make up the various systems and subsystems of the computing device to be coupled to the computing device after removal of the cover (120) allows for a technician or other individual to perform maintenance items on the computing device. The mechanical interlock (200) protects individuals from inadvertent injury while still providing a powered access to the components of the computing device.

The examples of the mechanical interlock (100, 200) of FIGS. 1 through 6 may be embodied in a housing of an electrical or electronic device, in a power supply interface, or other device where a mechanical interlock may be used to ensure safety to individuals before opening or accessing electrical or mechanical devices within a housing, while still allowing for the electrical or mechanical devices to be powered after removal of a cover of the housing.

The specification and figures describe a mechanical interlock for securing a cover to a housing. The mechanical interlock may include a cover latch coupled to a wall of a housing, and a spring biasing the cover latch in a first direction and coupled between the wall of the housing and the cover latch. The mechanical interlock may further include an arm coupled to the cover latch at a first end of the arm, and an electrical socket aperture defined within the wall of the housing juxtaposed to a second end of the arm. When the cover latch is in a first position, the arm permits for an electrical cord to interface with the electrical socket and precludes removal of a cover of the housing while the electrical cord is interfaced with the electrical socket. Further, when the cover latch is in a second position, the arm precludes the electrical cord from interfacing with the electrical socket. Still further, when the cover latch is returned to the first position via the spring after the cover is removed from the housing, the arm permits for the electrical cord to interface with the electrical socket. The examples of the mechanical interlock, housing, and power supply interface provide a lower-cost method for ensuring user safety, provide a safety mechanism that is less prone to inadvertent defeat, and provide a safety mechanism that is not impacted by printed circuit board redesigns, among other advantages.

The preceding description has been presented to illustrate and describe examples of the principles described. This description is not intended to be exhaustive or to limit these principles to any precise form disclosed. Many modifications and variations are possible in light of the above teaching.

What is claimed is:

1. A mechanical interlock for securing a cover to a housing, comprising:
    a cover latch coupled to a wall of a housing;
    a spring biasing the cover latch in a first direction and coupled between the wall of the housing and the cover latch;
    an arm coupled to the cover latch at a first end of the arm; and
    a power cable aperture defined within the wall of the housing juxtaposed to a second end of the arm;
    wherein, when the cover latch is in a first position, the arm permits for a power cord to interface with the power cable aperture and precludes removal of a cover of the housing while the power cord is interfaced with the power cable aperture,
    wherein, when the cover latch is in a second position, the arm precludes the power cord from interfacing with the power cable aperture, and
    wherein, when the cover latch is returned to the first position via the spring after the cover is removed from the housing, the arm permits for the power cord to interface with the power cable aperture.

2. The mechanical interlock of claim 1, wherein the arm is rotatable about a pivot, the pivot being coupled to the wall of the housing.

3. The mechanical interlock of claim 1, wherein the arm extends from the cover latch in a second direction perpendicular to the first direction.

4. The mechanical interlock of claim 1, wherein, when the cover latch is returned to the first position via the spring, the arm precludes the cover of the housing from coupling with the housing while the power cord is interfaced with the power cable aperture.

5. The mechanical interlock of claim 1, a lock aperture defined in the wall of the housing and the cover latch,
    wherein, when the cover latch is in the first position, the cover latch permits for a lock to interface with the housing and precludes removal of the cover of the housing while the lock is interfaced with the housing,
    wherein, when the cover latch is in the second position, the cover latch precludes the lock from interfacing with the housing, and
    wherein, when the cover latch is returned to the first position via the spring, the cover latch permits for the lock to interface with the housing.

6. A housing for an electrical device comprising:
    a cover comprising at least one locking pin;
    a cover latch coupled to a wall of the housing;
    a spring biasing the cover latch in a first direction and coupled between the wall of the housing and the cover latch;
    an arm coupled to the cover latch at a first end of the arm; and
    a power cable aperture defined within the wall of the housing juxtaposed to a second end of the arm;
    wherein, when the cover latch is in a first position:
        the at least one locking pin is engaged with the cover latch precluding removal of the cover from the housing, and
        the arm permits for a power cord to interface with the power cable aperture and precludes removal of a cover of the housing while the power cord is interfaced with the power cable aperture,
    wherein, when the cover latch is in a second position:
        the at least one locking pin is disengaged from the cover latch allowing removal of the cover from the housing, and
        the arm precludes the power cord from interfacing with the power cable aperture, and
    wherein, when the cover latch is returned to the first position via the spring, and the cover is removed from the housing, the arm permits for the power cord to interface with the power cable aperture.

7. The housing of claim 6, wherein the at least one locking pin comprises:
    a ramp; and
    a hook portion,
    wherein, when the cover is coupled to the housing:
        the ramp interfaces with the cover latch to force the cover latch in a second direction, and
        the hook portion engages with a notch defined in the cover latch to cause the cover latch to return to the first position.

8. The housing of claim 6, wherein the arm is rotatable about a pivot, the pivot being coupled to the wall of the housing.

9. The housing of claim 6, wherein the arm extends from the cover latch in a second direction perpendicular to the first direction.

10. The housing of claim 6, wherein, when the cover latch is returned to the first position via the spring, the arm precludes the cover of the housing from coupling with the housing while the power cord is interfaced with the power cable aperture.

11. The housing of claim 6, a lock aperture defined in the wall of the housing and the cover latch,
    wherein, when the cover latch is in the first position, the cover latch permits for a lock to interface with the housing and precludes removal of the cover of the housing while the lock is interfaced with the housing,
    wherein, when the cover latch is in the second position, the cover latch precludes the lock from interfacing with the housing, and
    wherein, when the cover latch is returned to the first position via the spring, the cover latch permits for the lock to interface with the housing.

12. A power supply interface comprising:
    a power cable aperture for receiving a power cord defined in a wall of a housing;
    a cover selectively removable from the housing, the cover comprising at least one locking pin;
    a cover latch coupled to a wall of the housing;
    a spring biasing the cover latch in a first direction and coupled between the wall of the housing and the cover latch; and an arm coupled to the cover latch at a first end of the arm
wherein, when the cover latch is in a first position:
- the at least one locking pin is engaged with the cover latch precluding removal of the cover from the housing, and
- the arm permits for the power cord to interface with the power cable aperture and precludes removal of a cover of the housing while the power cord is interfaced with the power cable aperture, wherein, when the cover latch is in a second position:
- the at least one locking pin is disengaged from the cover latch allowing removal of the cover from the housing, and
- the arm precludes the power cord from interfacing with the power cable aperture, wherein, when the cover latch is returned to the first position via the spring, and the cover is removed from the housing, the arm permits for the power cord to interface with the power cable aperture.

13. The power supply interface of claim 12, wherein the at least one locking pin comprises:

a ramp; and
a hook portion,
wherein, when the cover is coupled to the housing:

- the ramp interfaces with the cover latch to force the cover latch in a second direction, and
- the hook portion engages with a notch defined in the cover a h to cause the cover latch to return to the first position.

14. The power supply interface of claim 12, a lock aperture defined in the wall of the housing and the cover latch, wherein, when the cover latch is in the first position, the cover latch permits for a lock to interface with the housing and precludes removal of the cover of the housing while the lock is interfaced with the housing, wherein, when the cover latch is in the second position, the cover latch precludes the lock from interfacing with the housing, and wherein, when the cover latch is returned to the first position via the spring, the cover latch permits for the lock to interface with the housing.

15. The power supply interface of claim 12, wherein, when the cover latch is returned to the first position via the spring, the arm precludes the cover of the housing from coupling with the housing while the power cord is interfaced with the power cable aperture.

* * * * *